United States Patent [19]

Bayliff

[11] 4,100,371

[45] Jul. 11, 1978

[54] LOUDSPEAKER SYSTEM WITH PHASE DIFFERENCE COMPENSATION

[75] Inventor: Raymond William Bayliff, Hampton, England

[73] Assignee: Decca Limited, London, England

[21] Appl. No.: 778,472

[22] Filed: Mar. 17, 1977

[30] Foreign Application Priority Data

Mar. 24, 1976 [GB] United Kingdom ............... 11904/76

[51] Int. Cl.$^2$ .......................... H05K 5/00; H04R 3/14

[52] U.S. Cl. .................................. 179/1 E; 179/1 D; 181/144; 181/159

[58] Field of Search .................. 179/1 E, 1 GA, 1 D, 179/1 A, 1 AT; 181/144, 145, 147, 159

[56] References Cited

FOREIGN PATENT DOCUMENTS 892,793 3/1943 France ................................ 179/1 E 2,413,640 3/1974 Fed. Rep. of Germany ...... 179/1 D

*Primary Examiner*—Thomas W. Brown

*Assistant Examiner*—E. S. Kemeny

[57] ABSTRACT

A loudspeaker system in which two loudspeakers that cover different but overlapping frequency ranges, for example a treble range and a bass range, are mounted to radiate from co-planar mouths. Phase delay which is introduced by the radiator for the lower range is compensated by an acoustic delay which is disposed between the radiator of higher optimal frequency range and its mouth. This acoustic delay preferably takes the form of an exponential horn which introduces a delay corresponding to the displacement, from the common plane of the mouths, of the effective source of signals radiated by the lower frequency radiator at the cross-over frequency in the overlapping region.

3 Claims, 8 Drawing Figures

LOUDSPEAKER SYSTEM WITH PHASE DIFFERENCE COMPENSATION

FIELD OF THE INVENTION

This invention relates to loudspeaker systems particularly although not exclusively for domestic use, in which at least two acoustic radiators are employed to produce acoustic wave signals over a frequency range which is greater than a range for which a single loudspeaker can conveniently provide uniform response.

BACKGROUND TO THE INVENTION

It is notoriously difficult to design and construct a single loudspeaker to operate with sufficiently uniform efficiency over the entire range of frequencies which are normally required for the reproduction of sound with high quality. This range normally extends from approximately 30 to 15,000 Hz. Normally the loudspeaker system should exhibit such efficiency and power handling ability that a sufficient volume of sound can be generated with low distortion when the loudspeaker is used in conjunction with an ordinary power amplifier capable of delivering up to 50 watts. The loudspeaker should normallly distribute the middle- and high-frequency energy within a horizontal angle of ± 30° to 40° and a vertical angle of ± 20° to 30°, referred to the normal radiating axis of the loudspeaker, so that within these limits serious variations of frequency response do not occur. Although the invention is not intended exclusively for use within these limits, the limits do define the normal conditions of operation.

Owing to the difficulty of constructing a single loudspeaker as aforesaid, it is ordinary practice to use at least two acoustic radiators, each of which is designed to respond optimally in a part of the total frequency range for which the production of acoustic wave signals is required. The electrical drive signals to the acoustic radiators are usually divided by complementary filters so that each acoustic radiator is fed with signals appropriate to its part of the frequency spectrum. The filters which are normally employed are usually the so-called "two-pole" filters. They normally exhibit a rate of change of attenuation, beyond a respective cut-off frequency of 12 decibels per octave of frequency. The ordinary response of the filters may be adjusted by a variety of expedients to compensate for deviations of the responses of the loudspeakers from that which is desired. The filters are normally arranged so that each attenuates the signals which pass to the respective acoustic radiator but are within the frequency range pertinent to the other acoustic radiator. The frequency above which signals are principally radiated by one of the radiators and below which are principally radiated by the other radiator is called the crossover frequency. For simplicity it is convenient to consider systems in which there are only two acoustic radiators and one crossover frequency but it is possible to fulfil the requirements for the loudspeaker system by using three or more acoustic radiators, sub-dividing the spectrum of electrical signals for feeding to the acoustic radiators accordingly and equalising the responses of the individual radiators constituting the complete loudspeaker system.

Very many attempts have been made, without conspicious success, to achieve satisfactory performance. It is accordingly the object of the present invention to provide an improved loudspeaker system and according to another aspect of the invention a loudspeaker system and a filter for use with it, and thereby to facilitate the attainment of uniform response over a frequency range by the use of two or more loudspeakers to radiate signals preferentially over a respective part of the frequency range.

BRIEF SUMMARY OF THE INVENTION

According to the invention, a loudspeaker arrangement comprises two acoustic radiators which respond optimally to electrical signals in overlapping frequency ranges and which are mounted to radiate from coplanar mouths, and an acoustic delay which is disposed between the radiator of higher optimal frequency range and its mouth to compensate for phase delay introduced by the radiator of lower optimal frequency range at frequencies in the overlapping region of the ranges.

In a preferred form of the invention, the radiators are mounted on a common planar panel of an enclosure, the radiator of higher optimal frequency having an exponential horn of which the mouth is substantially in the plane of the panel and the radiator of lower frequency being of conical form, mounted with its base substantially in the plane of the panel. The delay introduced by the exponential horn may be such as to compensate for a displacement, to be explained hereinafter, of the effective source of signals radiated by the lower frequency radiator from the plane of the mounting panel towards the apex of the cone of this radiator.

The loudspeaker system may be provided with an amplifying circuit which is disposed for the reception of an audio-frequency input signal and the production of signals which are uniformly amplified, with respect to the input signal, in a respective one of two adjacent frequency ranges, the circuit including an active high-pass filter, which has substantially unity gain in its pass-band and is coupled to receive the input signal, and an amplifier which is disposed to amplify the difference between the output of the high-pass filter and the input signal.

The cut-off frequency of the high pass filter is preferably chosen to correspond to the crossover frequency. The power amplifier fed by the high-pass filter may feed the radiator of high optimal frequency range and the power amplifier fed by the difference amplifier may feed the acoustic radiator of lower optimal frequency range. Although the amplifying circuit requires a separate power amplifier for each radiator, each amplifier need only handle a limited frequency range and in practice the design and construction of the amplifiers can be substantially simpler than those of an amplifier which may have to handle signals over the entire operating range of the loudspeaker system.

DESCRIPTION OF THE ACCOMPANYING DRAWINGS

DETAILED DESCRIPTION OF THE PREFERRED EMBODIMENT

Figure 1:
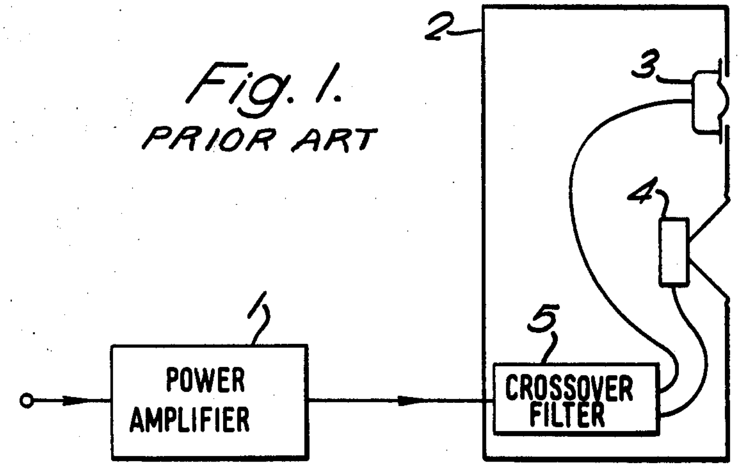
Fig. 1. PRIOR ART
FIGS. 1 to 3 illustrate the general arrangement, a crossover filter and the frequency response of an ordinary double loudspeaker system.

FIG. 1 illustrates the general arrangement of a common form of double loudspeaker system for radiating acoustic signals in the normal audio frequency range. Input audio frequency electrical signals are fed to a power amplifier 1. In an enclosure 2 are mounted a "treble" loudspeaker and a "bass" loudspeaker 4 which are fed through a crossover filter 5 from the power amplifier 1. Very typically in such a two loudspeaker system the bass loudspeaker is of medium to large diameter, typically of diameter 200 mm or greater, being a moving coil loudspeaker including a cone radiator driven at its apex. The enclosure 2 in which the bass unit is mounted effectively determines performance of the loudspeaker system at very low frequencies. The "treble" loudspeaker 3 is commonly of small diameter, typically of 75 mm or less, and may be constituted either by a cone radiator or a dome radiator. In normal practice the treble loudspeaker is mounted on the front face of the enclosure in the same plane as the mouth of the bass loudspeaker. It is usually desirable for the mounting centres of the two units to be as close as possible and disposed vertically one above the other, the treble unit being the upper one.

Figure 2:
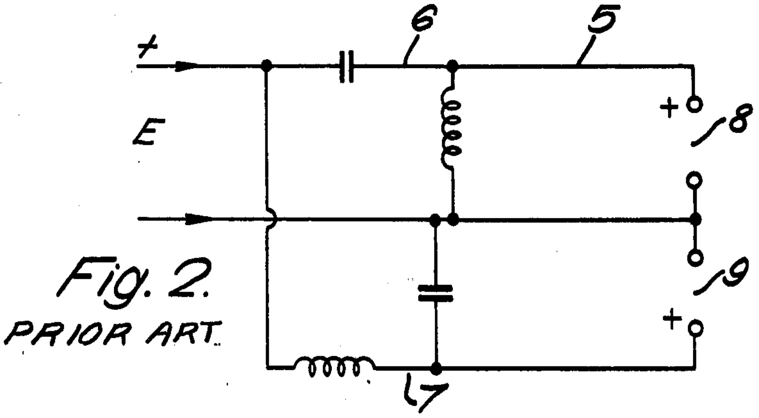
Fig. 2. PRIOR ART

FIG. 2 illustrates a common form of crossover filter 5. It has a high pass section 6, shown here as a simple L-section with a series capacitor and a shunt inductor feeding an output port 8 for the treble loudspeaker and a low pass section, here shown as a simple L-section filter with a series inductor and a shunt capacitor feeding an output port 9 for the bass loudspeaker.

Figure 3:
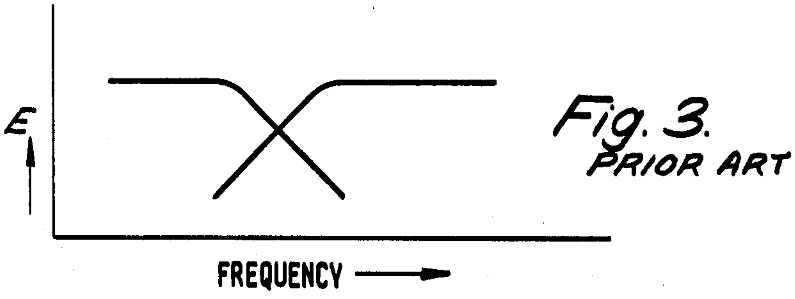
Fig. 3. PRIOR ART

FIG. 3 illustrates a typical frequency response for the crossover network shown in FIG. 2.

Theoretically, in a system as described with reference to FIGS. 1 and 2, the treble and bass loudspeakers make equal contributions to the radiated acoustic energy at the crossover frequency and departure of the signal frequency from the crossover frequency should be accompanied by a smooth increase in the contribution of either the treble loudspeaker or the bass loudspeaker as the case may be to the radiated power and a complementary reduction in the contribution of the other loudspeaker. The coherent acoustic summation of the radiated energies necessary for this result is difficult to achieve because there are phase shifts, having two main sources, which affect the performance of the system.

Figure 4:
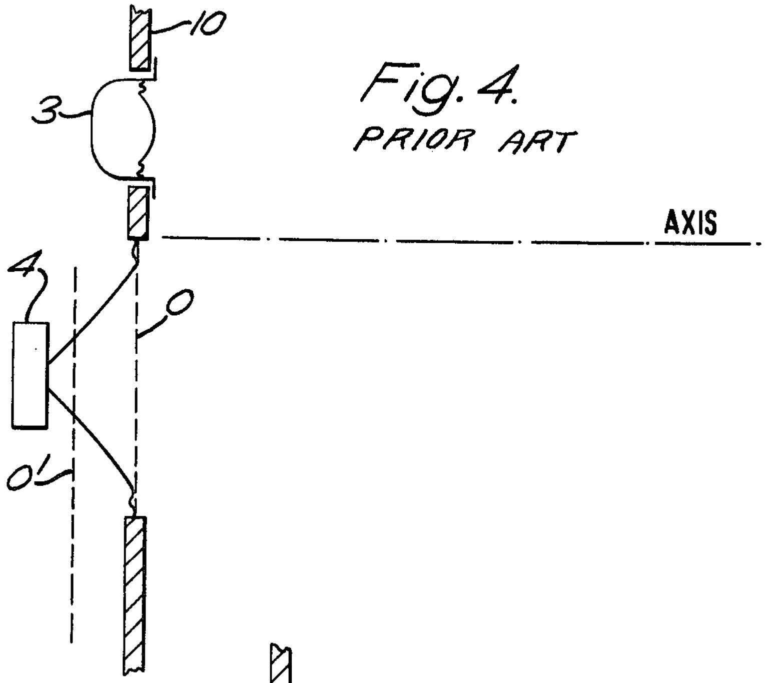
Fig. 4. PRIOR ART
FIGS. 4 and 5 are explanatory diagrams.

The first source of phase shift lies in the loudspeakers themselves. The behaviour of an acoustic radiator, particularly a cone radiator, is complex and measurements show that the apparent origin of the acoustic waves is approximately located at the base of the cone, that is to say the mouth of the radiator, at low frequencies whereas at high frequencies the origin is nearer the apex of the cone and accordingly further from an observer or measuring device positioned on the axis of the loudspeaker. It is unlikely that the bass and treble loudspeakers will have matching characteristics of phase shift against frequency because they are necessarily subtantially different in size. It may be found that the distances from, for example, the plane of the front panel of the enclosure of the effective origins of acoustic waves differ by 50 mm or greater. This is equivalent to approximately half a wave length or 180° of phase shift at a frequency of about 3 kHz, which is a commonplace crossover frequency. FIG. 4 illustrates a panel 10 which supports the treble and bass loudspeakers 3 and 4. The apparent original surface of acoustic waves from the bass loudspeaker moves from the plane 0 in the plane of the panel to the plane 0′ behind the panel, the distance 00′ constituting a path difference between bass and treble signals radiated to an axially-positioned observer.

The other main source of phase error is the crossover filter. For example, in the network of FIG. 2, the low pass filter section has an output phase which increasingly lags with increasing frequency and is equal to 90° at the crossover frequency. The high pass section introduces a leading phase shift which is equal to 90° at the crossover frequency. Accordingly, even if the bass and treble loudspeakers were ideal and introduced no phase error, the phase shifts introduced by the sections of the crossover filter would cause the bass and treble loudspeakers to radiate signals which are in destructive antiphase at the crossover frequency. In practice the phase shifts introduced by the loudspeakers modify the response of the crossover filter but it is common to discover untoward variations in the amplitude against frequency response of the system in the region of the crossover frequency. The severity and the exact location in the frequency spectrum of these variations alter as the position of an observer or measuring instrument varies.

Many proposals have been made for reducing this phase interference or its effects. It has been proposed to use filter sections with gentler attentuation characteristics at the cost of increasing the range of overlap and to use rather more complex filters at the cost of producing filters which are less tolerant to variation in component values.

Figure 5:
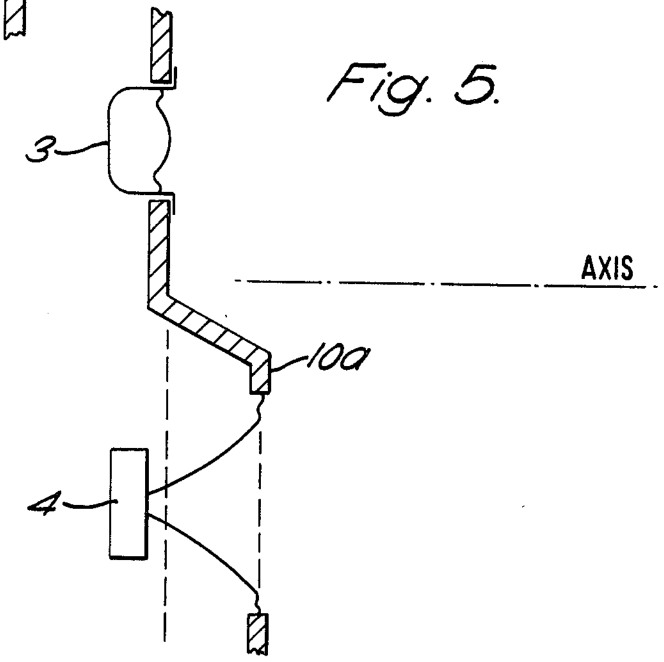

FIG. 5 illustrates one proposal for compensating for the difference in the phase shifts introduced by the loudspeakers themselves. According to this proposal the mouth of the bass loudspeaker is mounted forwardly of that of the treble loudspeaker, the front panel 10*a* of the enclosure in which the loudspeakers are mounted being stepped to accommodate the required spatial staggering of the loudspeakers. The magnitude of the step in the front panel 10*a* in FIG. 5 could be equal to the effective path difference of signals radiated by the two loudspeakers at the crossover frequency. However, a substantial objection to this proposal is that the treble radiator must be mounted well clear of the step or additional unwanted effects will be caused by interference between the acoustic waves received directly by an observer or measuring instrument from the treble loudspeaker and those which are reflected from the step. It is normally desirable to provide the smallest possible spatial separation between the loudspeakers in order to provide satisfactory summing of the acoustic waves radiated by the two loudspeakers over a substantial range of variation of the direction of radiation.

Figure 6:
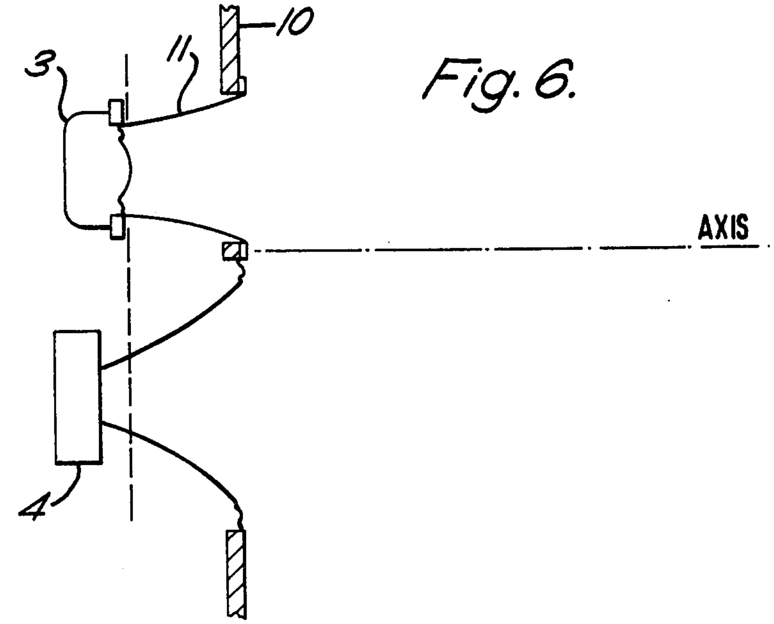
FIG. 6 is a schematic diagram of one form of loudspeaker system embodying the invention.

FIG. 6 illustrates one form of a loudspeaker system according to the invention. This embodiment is, for convenience, disposed in the front mounting panel 10 of an enclosure in which the treble loudspeaker 3 and a bass loudspeaker 4 are located. The mouths of the two loudspeakers are substantially coplanar with the mounting panel and are disposed closely adjacent each other. The treble loudspeaker is provided with acoustic delay between the radiator element itself and the mouth of the loudspeaker. This delay is in the form of an exponential horn whose length is chosen to correspond to the delay required to match the delay introduced by the bass loudspeaker at the crossover frequency. This choice of delay is thought to represent the optimum. A smaller or greater delay could be provided if desired.

Figure 7:
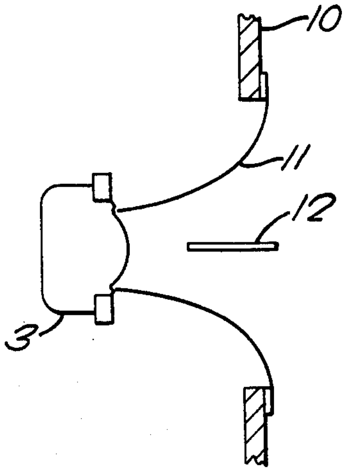
FIG. 7 illustrates a preferred but optional detail of the system shown in FIG. 6.

A loudspeaker system according to FIG. 6 has been constructed. It comprises, for the bass loudspeaker, a commercially available loudspeaker (Type B200 made by KEF Electronics Limited): namely for 200 mm diameter cone bass loudspeaker and a dome treble loudspeaker of 33 mm diameter (Type T15 made by KEF Electronics Limited). The nominal crossover frequency was chosen after experiment to be 1450 Hz. Measurements show that the effective radiating origin of the bass loudspeaker at that frequency was approximately 50 mm behind the front surface of the mounting panel. An exponential horn was constructed according to the procedure described in "Acoustical Engineering" by H. F. Olsen (Van Nostrand 1957). The horn, denoted by the reference 11 in FIG. 6, was designed to have an exponential expansion path 50 mm long to correspond to the desired delay. A flare rate coefficient was chosen to yield a perimeter for the mouth of 410 mm. This provides a satisfactory response at the lowest frequency which ought to be radiated by the treble loudspeaker, namely approximately 1000 Hz. The exponential horn was constructed to have a rectangular mouth approximately 150 mm wide and 76 mm high. These dimensions permit the mounting of the treble unit immediately above the bass unit with a minimum separation between the axes of the loudspeakers of approximately 150 mm. If desired as shown in FIG. 7, a vertical partition 12 may be disposed in the mouth of the exponential horn to increase the horizontal dispersion of high frequency waves from the treble loudspeaker.

The system constructed as described allows coherent and predictable summing of the radiated acoustic waves in the region of the crossover frequncy.

Figure 8:
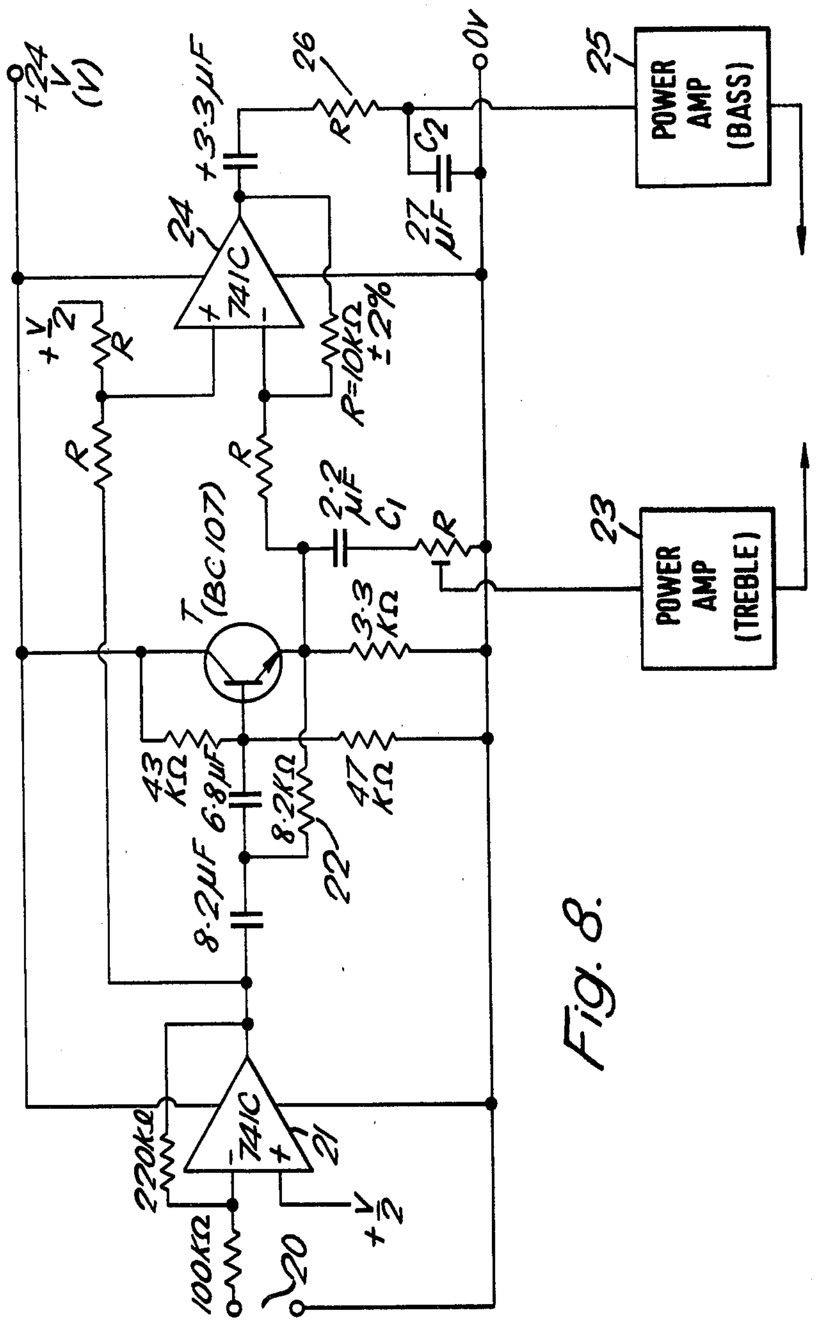
FIG. 8 is a diagram of an electrical circuit which may be used for applying electrical drive signals to the loudspeaker system illustrated in FIG. 6.

FIG. 8 is a diagram of a preferred form of crossover filter which is primarily intended for use with the loudspeaker system of FIG. 6. In order to achieve fully satisfactory performance it is desirable to reduce phase errors arising from both the sources mentioned earlier.

The filter to be described normally requires a separate power amplifier for the bass and treble loudspeakers but because each amplifier is only required to handle a limited frequency range some economies may be made in their design. Moreover, the acoustic delay horn which is associated with the treble loudspeaker has the additional advantage of greatly increasing the acoustic efficiency of the treble loudspeaker, particularly in the low frequency region of its range. The treble power amplifier may therefore only be of modest power handling ability. In practice, a treble power amplifier of 15 watts output may be adequate when used in conjunction with a bass power amplifier capable of producing 40 to 50 watts.

The principal function of the filter shown in FIG. 8 is to provide amplification of the acoustic radiator of higher optimal range through a high pass filter of unity gain in its pass band and to provide amplification for the acoustic radiator of lower optimal frequency range according to the difference between an output corresponding to the output of the high pass filter and the original input signal.

In the circuit of FIG. 8, an audio signal at an input terminal pair 20 is slightly amplified by an input buffer amplifier 21, which may be constituted by an ordinary integrated circuit such as the well-known Type 741C. The primary purpose of this amplifier is to provide a low impedance source for signals fed to a two-pole active high pass filter 22 which is partly constituted by an emitter follower of unity gain. The filter comprises a T-section RC filter with series capcitors and a shunt resistor part of which constitutes an emitter follower resistor for the transistor. The component values indicated in the drawing provide an attenuation rate of twelve decibels per octave below the cut-off frequency and a cut-off frequency of 1450 Hz.

The output of the high pass filter is fed through a capacitor $C_1$ and an adjustable potentiometer to a treble power amplifier 23. The adjustable potentiometer enables the sensitivity of the treble channel to be equalised as necessary with that of the bass channel. The capacity of the coupling capacitor $C_1$ is chosen to provide a progressive attenuation of the low freqency signals fed to the treble amplifier to offset the tendency of the treble loudspeaker with its acoustic delay horn to overemphasise signals in the low frequency part of its frequency range.

The output of the high pass filter 22 is also fed to one input of a subtractor 24 which receives also the preamplified input signal. In the particular circuit shown, the subtractor is an integrated circuit operational amplifier Type 741C which is connected to operate in a unity gain, subtractive mode in which the output signal is equal to the difference between the signals, namely the (preamplified) full band-width and the output of the high pass filter, which are fed to the non-inverting input and the inverting input respectively. Because the high pass filter has unity gain in its pass band the output of the amplifier 24 is the exact complement of the output of the high pass filter.

The output of the subtractor 24 is fed to the input of the bass power amplifier 25 through a simple CR equaliser 26 whose values may be chosen to control a tendency of the particular bass unit to increase its acoustic output at the high end of its frequency range.

A simpler system may be constructed using a loudspeaker as arranged in FIG. 6 in conjunction with an ordinary crossover network which comprises LC complementary high pass and low pass filters as shown in FIG. 2 amd feeds a single power amplifier. The phase reversal of signals at the crossover frequency may be compensated by reversing the polarity of the connections to either the treble or the bass loudspeaker unit. The trimming of the frequency response which is effected in the circuit of FIG. 5 by the capacitors $C_1$ and $C_2$ in conjunction with their associated resistors can be achieved by appropriate choice of component values for the filter sections.

This simpler version will reduce phase errors arising from the different sizes and natures of the loudspeaker units but exhibit some loss of ability in handling transient signals compared with the preferred embodiment that has been described. In addition the circuit will provide a progressive phase shift between the input signal and the acoustic outputs throughout the entire audio frequency range although this phase shift may be disregarded.

The invention is, as previously indicated, applicable in a loudspeaker system in which three or more loudspeakers radiate signals in different, but overlapping frequency ranges. In such a system, each pair of loudspeakers associated with adjacent, overlapping frequency ranges would be disposed as described in the foregoing.

I claim:

1. A loudspeaker system comprising: first and second acoustic radiators which respond optimally to electrical signals in a higher frequency range and a lower frequency range respectively, said frequency ranges having a common overlapping region, and said radiators having respective mouths; means for mounting said radiators in a predetermined disposition in which said mouths are co-planar; and means for compensating for phase delay introduced by said second radiator, of lower optimal frequency range, at frequencies in the said overlapping region, this means comprising an acoustic delay disposed between the first radiator, of higher optimal frequency range, and the mouth thereof.

2. A loudspeaker according to claim 1, in which: said mounting means comprises a planar panel of an enclosure, said second radiator being of conical form and mounted with its mouth substantially in the plane of the panel, and said first radiator including an exponential horn of which the said mouth is substantially in the plane of the panel, said horn having a delay which compensates for displacement of the effective source of signals radiated by the said second radiator from the plane of the mounting panel towards the apex of the cone of the said second radiator.

3. A loudspeaker according to claim 1, further comprising: an electrical amplifying circuit which is disposed for the reception of an audio frequency input signal and the production of signals which are uniformly amplified, with respect to the input signal, in a respective one of two adjacent frequency ranges, the circuit including an active high-pass filter, which has substantially unity gain in its pass-band and is coupled to receive the input signal, means for coupling the output of the high-pass filter to said first radiator, an ampllifier which is disposed to amplify the difference between the output of the high-pass filter and the said input signal, and means for coupling this difference to said second radiator.

* * * * *